(12) United States Patent
Hu (10) Patent No.: US 10,153,234 B2
(45) Date of Patent: Dec. 11, 2018

(54) SYSTEM IN PACKAGE

(71) Applicant: Dyi-Chung Hu, Hsinchu (TW)

(72) Inventor: Dyi-Chung Hu, Hsinchu (TW)

(*) Notice: Subject to any disclaimer, the term of this patent is extended or adjusted under 35 U.S.C. 154(b) by 0 days.

(21) Appl. No.: 15/341,132

(22) Filed: Nov. 2, 2016

(65) Prior Publication Data
US 2017/0125348 A1   May 4, 2017

Related U.S. Application Data (63) Continuation-in-part of application No. 14/931,044, filed on Nov. 3, 2015, now Pat. No. 9,673,148.

(51) Int. Cl.
| H01L 29/40 | (2006.01) |
| H01L 23/538 | (2006.01) |
| H01L 23/31 | (2006.01) |
| H01L 23/522 | (2006.01) |
| H01L 23/532 | (2006.01) |
| H01L 23/00 | (2006.01) |

(52) U.S. Cl.
CPC ...... *H01L 23/5386* (2013.01); *H01L 23/3114* (2013.01); *H01L 23/5226* (2013.01); *H01L 23/53242* (2013.01); *H01L 24/19* (2013.01); *H01L 24/20* (2013.01); *H01L 24/96* (2013.01); *H01L 2224/04105* (2013.01); *H01L 2924/14* (2013.01); *H01L 2924/18162* (2013.01)

(58) Field of Classification Search
CPC ............. H01L 23/5386; H01L 23/3114; H01L 23/5226; H01L 23/53242; H01L 24/19; H01L 24/20; H01L 24/96; H01L 2924/18162; H01L 2924/14; H01L 2224/04105

See application file for complete search history.

(56) References Cited

U.S. PATENT DOCUMENTS

| 2006/0042834 | A1 | 3/2006 | Lee et al. | |
| 2011/0316146 | A1* | 12/2011 | Pagaila | H01L 24/19 |
| | | | | 257/737 |
| 2014/0091471 | A1 | 4/2014 | Chen et al. | |
| 2014/0106536 | A1* | 4/2014 | Su | H01L 21/76898 |
| | | | | 438/386 |
| 2014/0124925 | A1* | 5/2014 | Sidhu | B23K 35/0244 |
| | | | | 257/738 |

(Continued)

*Primary Examiner* — Vongsavanh Sengdara
(74) *Attorney, Agent, or Firm* — JCIPRNET (57) ABSTRACT

An electronic system without using solder balls between electrical components, and without using interposer between chips and package substrate, without using a discrete system board for the chip package to mount. At least one chip is wrapped by molding material, a first redistribution circuitry is built on a bottom side of the molding material. A plurality of first inverse T-shaped metals of the first redistribution circuitry are electrically coupled to the at least one chip; a second redistribution circuitry is built on a bottom side of the first redistribution circuitry. A plurality of second inverse T-shaped metals of the second redistribution circuitry are electrically coupled to the first redistribution circuitry. Either the first redistribution circuitry or the second redistribution circuitry has at least a first extension extended beyond a corresponding side surface of the molding material to electrically couple to at least one device.

20 Claims, 9 Drawing Sheets

(56) References Cited

U.S. PATENT DOCUMENTS

2015/0325556 A1* 11/2015 Lai .................... H01L 23/49811
                                                              257/777
2015/0371932 A1* 12/2015 Hu ..................... H01L 21/4825
                                                              257/666

* cited by examiner

Fig.6

SYSTEM IN PACKAGE

RELATED APPLICATIONS

The present application is a Continuation-in-part of U.S. application Ser. No. 14/931,044, filed Nov. 3, 2015, the disclosure of which is hereby incorporated by reference herein in its entirety.

BACKGROUND

Technical Field

The present invention relates to an electrical package system; especially relates to a system in package (SiP) without using the following components: discrete solder balls, discrete interposer, discrete package substrate, underfill, and discrete system board.

Description of Related Art

Figure 1:
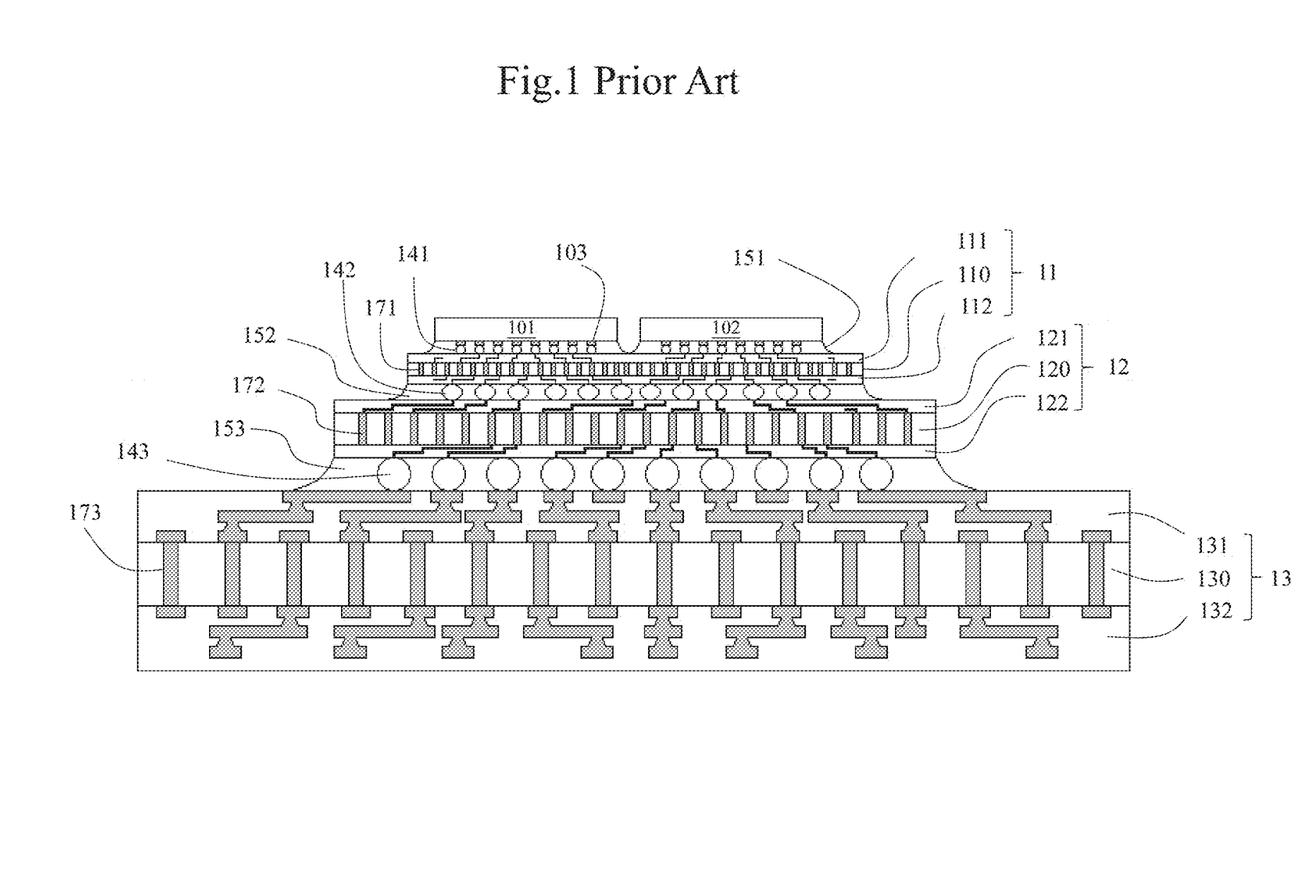
FIG. 1 shows a prior art.

FIG. 1 Shows a Prior Art.

FIG. 1 shows chips 101, 102 configured on a top side of a traditional system in package. Three pluralities of solder balls 141, 142, 143 have been used to join each two components of the system. A first plurality of solder balls 141 join the chips 101, 102 to the silicon interposer 11. A second plurality of solder balls 142 join the silicon interposer 11 to the package substrate 12. A third plurality of solder balls 143 join the package substrate 12 to the system board 13.

Each of the chips 101, 102 has a plurality of I/O pads 103 configured on a bottom side of the chip. The silicon interposer 11 has a core silicon substrate 110. A plurality of conductive through silicon vias (TSVs) 171 passes through the core silicon substrate 110 as an electrical connection between a top redistribution layer (RDL) 111 and a bottom redistribution layer (RDL) 112. The top RDL 111 is configured on a top surface of the silicon substrate 110, and a bottom RDL 112 is configured on a bottom surface of the silicon substrate 110. The plurality of first solder balls 141 are configured between the plurality of I/O pads and the top RDL 111 as an electrical connector there between.

A package substrate 12 is configured on a bottom side of the silicon interposer 11. The package substrate 12 has a core substrate 120 made of laminates and prepregs, a plurality of conductive through laminate vias (TLVs) 172 pass through the core substrate 120. A top RDL 121 is configured on a top side of the core substrate 120, and a bottom RDL 122 is configured on a bottom side of the core substrate 120. A plurality of second solder balls 142 are configured between the silicon interposer 11 and the package substrate 12 as an electrical connector there between. The TLVs 172 electrically couples the top RDL 121 and the bottom RDL 122.

A system board 13 is configured on a bottom of the package substrate 12. The system board 13 has a core substrate 130 made of laminates and prepregs, a plurality of conductive through laminate vias (TLVs) 173 passes through the core substrate 130. A top RDL 131 is configured on a top side of the core substrate 130 and a bottom RDL 132 is configured on a bottom side of the core substrate 130. A plurality of third solder balls 154 are configured between the package substrate 12 and the system board 13 as an electrical connector there between. The TLVs 173 electrically couples the top RDL 131 and the bottom RDL 132.

A first underfill 151 is filled into a space between chips 101, 102 and the silicon interposer 11. A second underfill 152 is filled into a space between silicon interposer 11 and the package substrate 12. A third underfill 153 is filled into a space between the package substrate 12 and the system board 13.

The prior art uses three plurality of solder balls 141, 142, 143 as the electrical connectors to join neighbored two electrical components of the system. The prior art further uses a silicon interposer 11 as an electrical connector between the chips 101, 102 and the package substrate 13. The prior art further uses a discrete system board 13. The prior art further more uses three underfill 151, 152, 153 for advancing the reliability between the interface of the neighbored two discrete electrical components. It is a bulky electronic system. In response to a demand for smaller, lighter and thinner consumer products, a new electronic system meeting the demand has been eager to develop.

DETAILED DESCRIPTION OF THE INVENTION

A simplified structure and more reliable system in package (SiP) is developed according to the present invention. The disclosed system does without using solder balls, interposer, package, system board, and underfill. A first RDL 21 is built according to IC design to integrate the plurality of first solder balls 141 and the silicon interposer 11 of the prior art. A second RDL 22 is built according to PCB design rule to integrate the plurality of second solder balls 142, the package substrate 12, the plurality of third solder balls 143, and the system board 13 of the prior art. The present invention made the SiP an extremely thin package.

Figure 2:
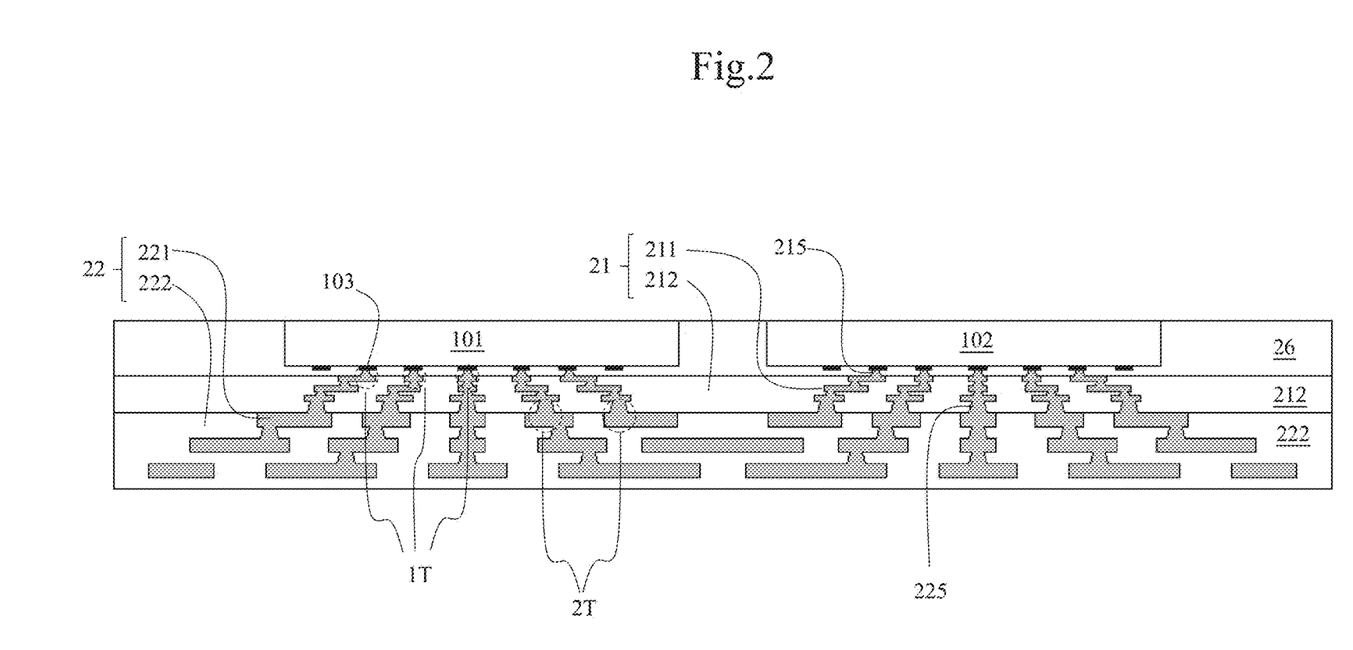
FIG. 2 shows a first embodiment according to the present invention.

FIG. 2 Shows a First Embodiment According to the Present Invention.

FIG. 2 shows a system in package (SiP) which comprises chips 101, 102 configured on a top side of the package. Each of the chips 101, 102 has a plurality of I/O pads 103 configured on a bottom side of each chip; molding material 26 wraps the chips 101, 102 at least four lateral sides and a bottom side of the chips.

A first RDL 21 has a first redistribution circuitry 211 embedded in a first dielectric layer 212. The first redistribution circuitry 211, fabricated according to IC design rule, is configured on a bottom side of the molding material 26. A top end of the first redistribution circuitry 211 is electrically coupled to the I/O pads 103 of the chips through a plurality of first metal vias 215.

A second RDL 22 has a second redistribution circuitry 221 embedded in a second dielectric layer 222. The second redistribution circuitry 221, fabricated according to PCB design rule, is configured on a bottom side of the first redistribution circuitry 211. A top end of the second redistribution circuitry 221 is electrically coupled to the first redistribution circuitry 211 through a plurality of second metal vias 225.

Figure 3A:
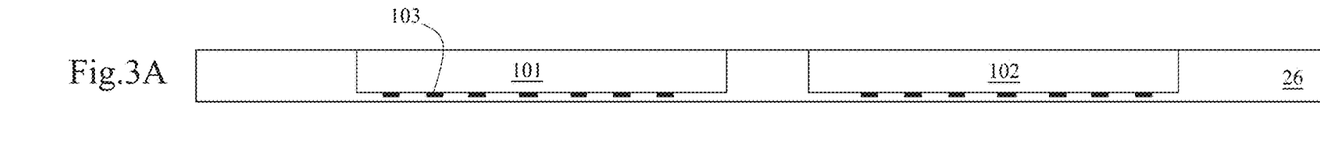
FIGS. 3A~3C show a fabricating process for the first embodiment according the present invention.
Figures 3B, 3C:
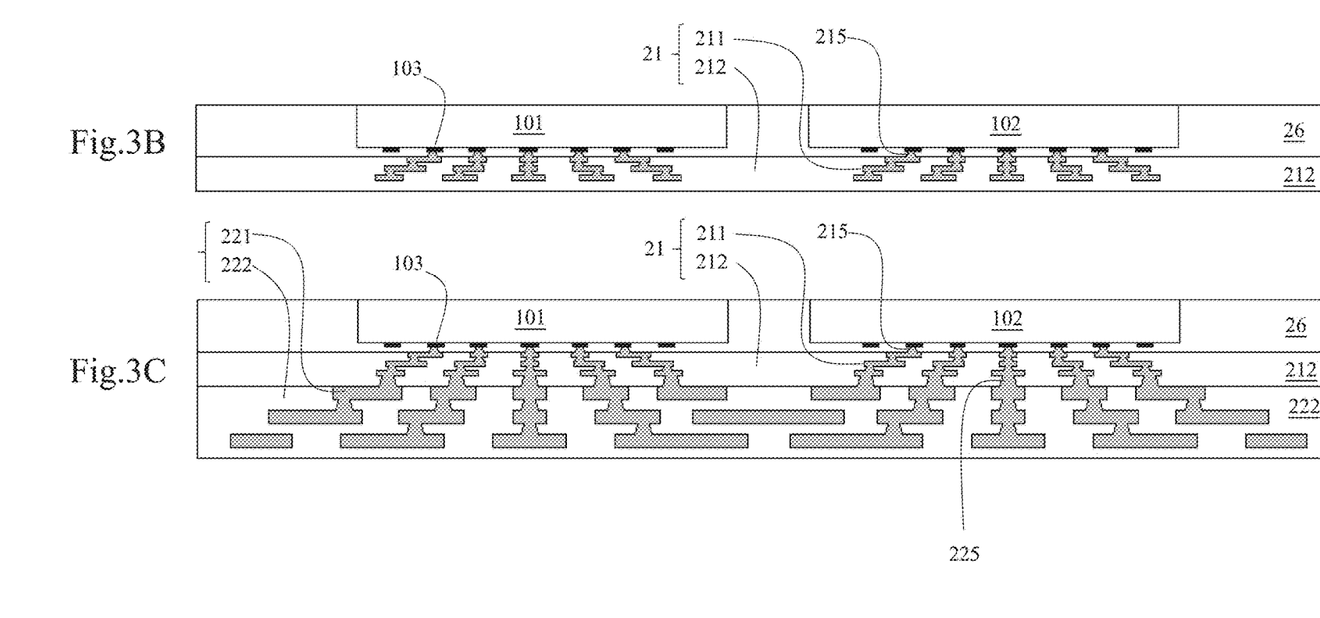

FIGS. 3A~3C Show a Fabricating Process for the First Embodiment According the Present Invention.

FIG. 3A shows: wrapping a plurality of chips 101, 102 with molding material 26; wherein a temporary carrier (not shown) configured on a top side of the chips 101, 102 is omitted to describe for simplification of the specification.

FIG. 3B shows: forming a first RDL 21 on a bottom surface of the molding material 26; the first RDL 21 has a first redistribution circuitry 211 embedded in a first dielectric layer 212.

FIG. 3C shows: forming a second RDL 22 on a bottom side of the first RDL 21. The second RDL 22 has a second redistribution circuitry 221 embedded in a second dielectric layer 222.

Figure 4:
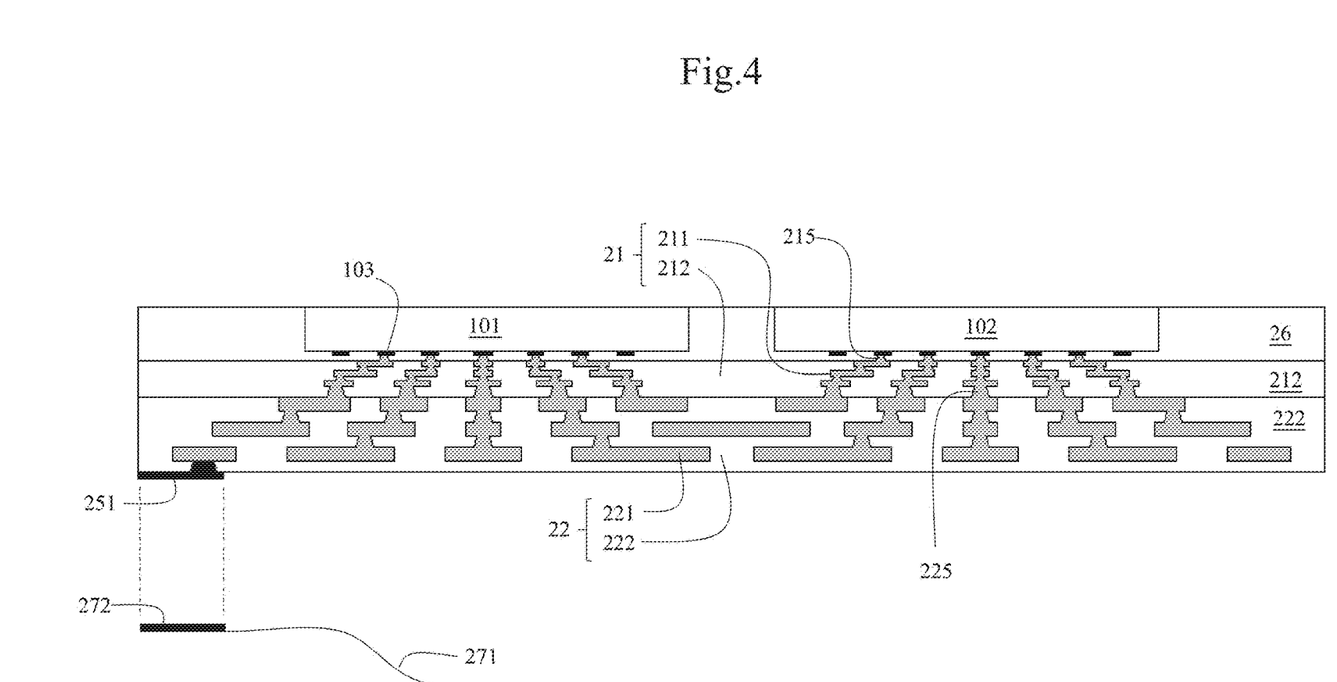
FIG. 4 shows a second embodiment according to the present invention.

FIG. 4 Shows a Second Embodiment According to the Present Invention.

FIG. 4 shows a plurality of first gold fingers 251 formed on a bottom side of the second dielectric layer 222. The plurality of the first gold fingers 251 are electrically coupled to the second redistribution circuitry 221. The plurality of the first gold fingers 251 function as I/O contacts for the package system.

A flexible circuit board 271 can be prepared separately. A plurality of gold fingers 272 corresponding to the plurality of gold fingers 251 are formed on a left end of the flexible circuit board 271. A right end of the flexible circuit board 271 is electrically coupled to a power supply, additional electrical components, or a control system.

Figure 5:
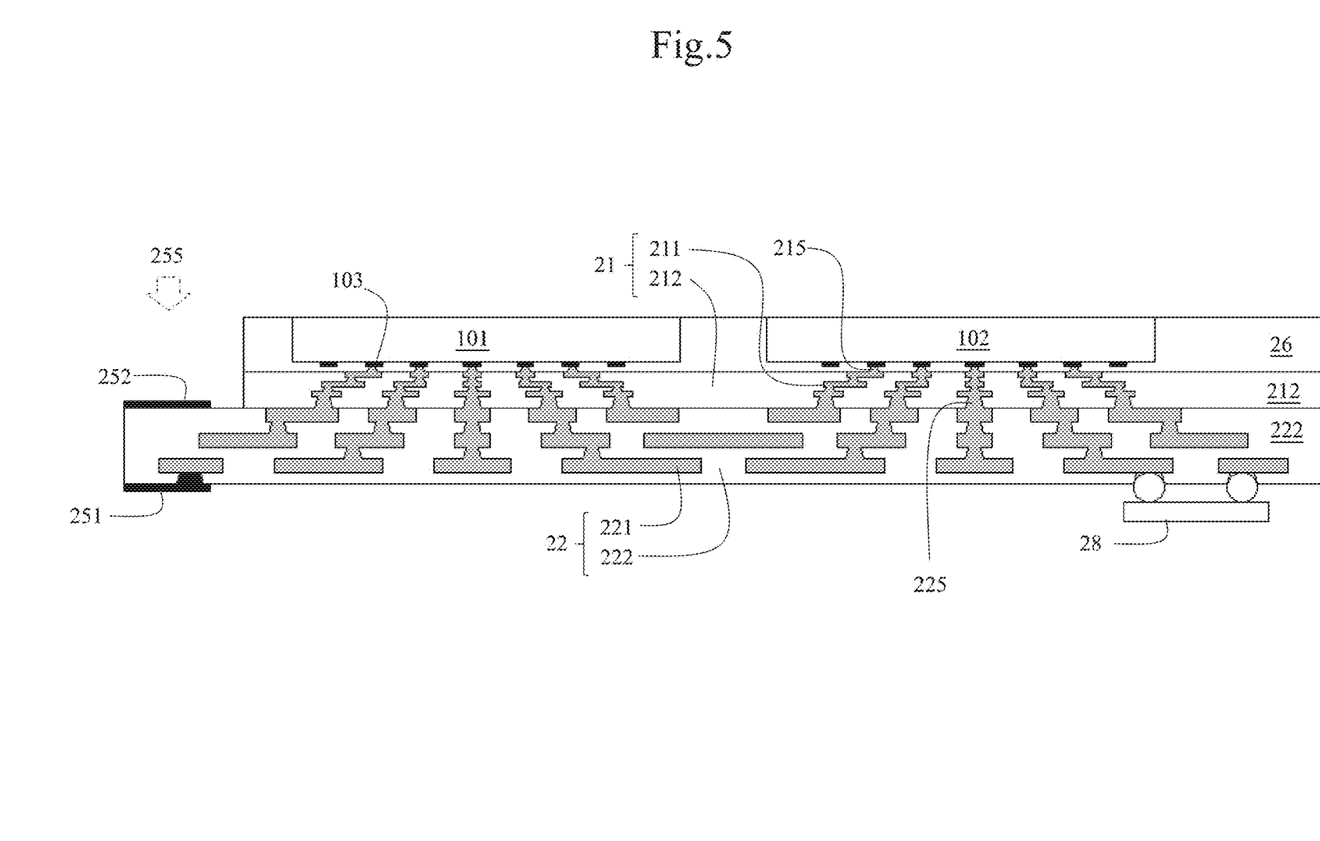
FIG. 5 shows a third embodiment according to the present invention.

FIG. 5 Shows a Third Embodiment According to the Present Invention.

Figure 6:
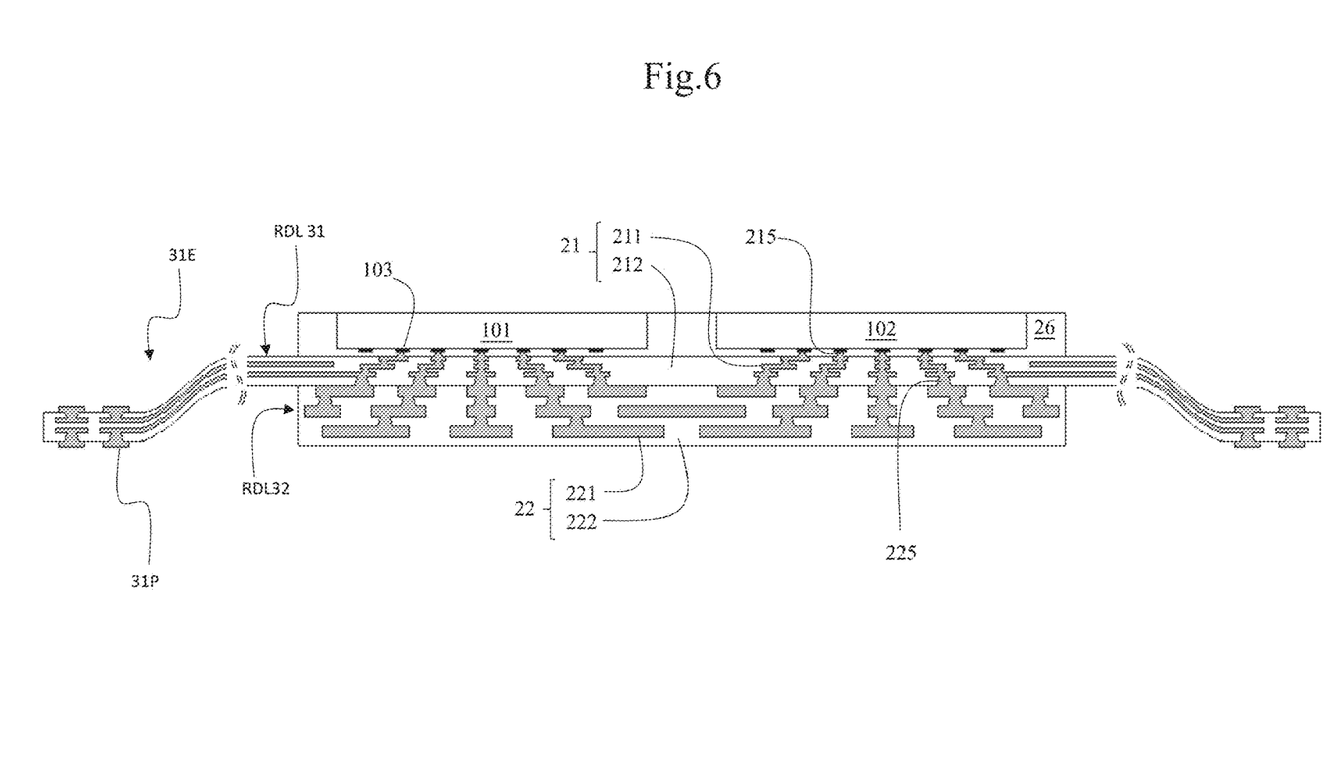
FIG. 6 shows a fourth embodiment according to the present invention.

FIG. 5 shows the second RDL 22 is made wider than the first RDL 21 in the left side. FIG. 5 shows an extended area 255 is formed on a left side of the third RDL 22. A plurality of first gold fingers 251 are formed on a bottom side of the extended area 255. A plurality of second gold fingers 252 are formed on a top side of the extended area 255. The gold fingers 251, 252 are electrically coupled into a gold finger socket (not shown) or other connector (not shown) so that the package can be electrically coupled with additional electronic components. FIG. 6 further shows, at least one passive component 28 such as resistor, capacitor, inductor or other electronic components (not shown) can be optionally configured on a bottom side of the third RDL 23 and electrically coupled to the third redistribution circuitry 231.

Each of the metal via 215, 225 incorporated with its bottom flat metal forms an inverse T-shaped metal 1T, 2T. Since the inverse T-shaped metal 1T, 2T is formed in a same process, the inverse T-shaped metal 1T, 2T is a single metal, that is to say, no demarcation exists between the top via 215, 225 and its bottom flat metal respectively. Each of the metal via 215, 225 has a shape with top narrow and bottom wide.

FIG. 6 Shows a Fourth Embodiment According to the Present Invention.

FIG. 6 shows two chips 101, 102 are embedded in the molding material 26; a first RDL 31 is configured on a bottom surface of the molding material 26; the first RDL 31 has a first redistribution circuitry 211 embedded in a first dielectric layer 212. A plurality of first inverse T-shaped metals 1T of the first RDL 31 electrically coupled to the chips 101, 102. A second RDL 32 is configured on a bottom side of the first RDL 31. The second RDL 32 has a second redistribution circuitry 221 embedded in a second dielectric layer 222. A plurality of second inverse T-shaped metals 2T of the second redistribution circuitry 221 is electrically coupled to the first redistribution circuitry 211.

The first RDL 31 has at least one extension 31E extended beyond a corresponding side surface of the molding compound 26. A plurality of contact pads 31P is configured on a terminal of the at least one extension 31E for electrically coupled to an electronic device such as microphone, power, volume key, speaker, camera . . . etc.

Each circuit of the second redistribution circuitry 211 is thicker and wider than each circuit of the first redistribution circuitry 212; the second inverse T-shaped metals 2T has a density less than the first inverse T-shaped metals 1T.

Figure 7:
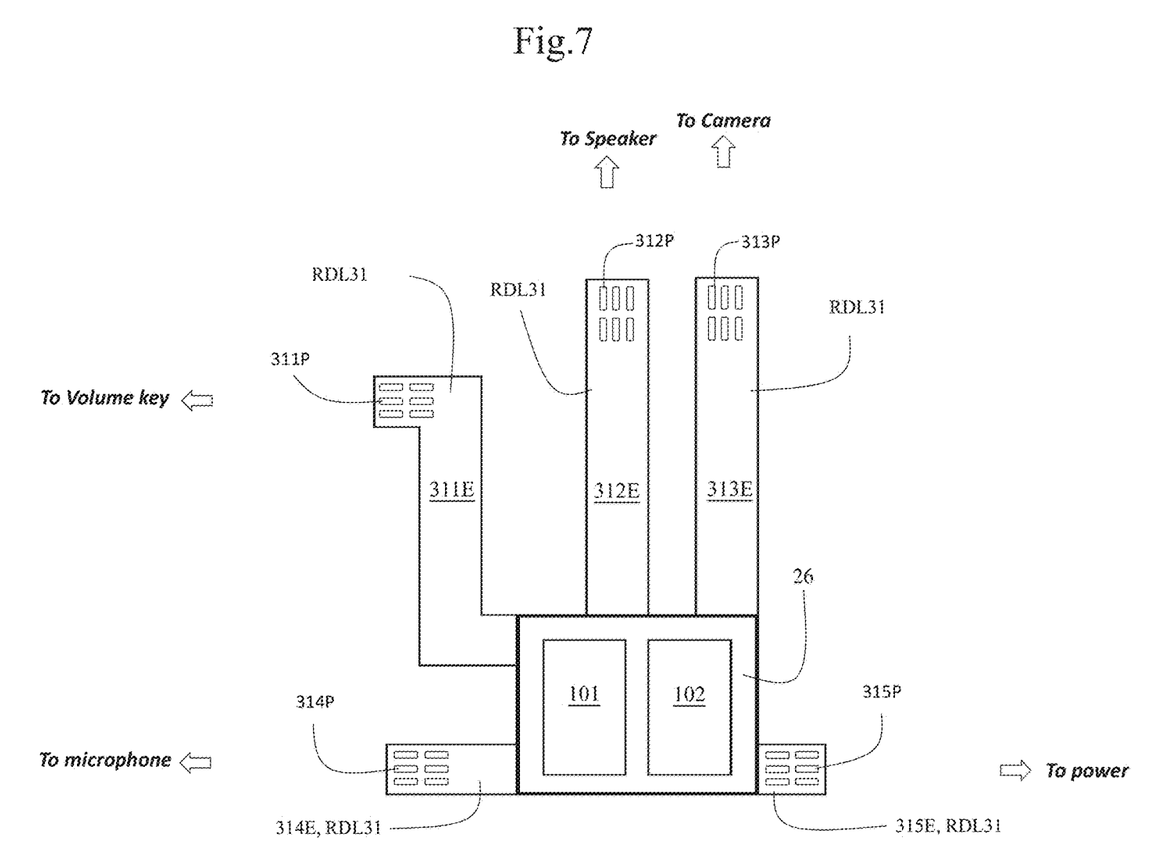
FIG. 7 shows a top view for an application of FIG. 6.

FIG. 7 Shows a Top View for an Application of FIG. 6.

FIG. 7 shows a top view for an application of FIG. 6, for example, in a mobile electronic device. FIG. 7 shows, viewing from top, the two chips 101, 102 are embedded in the molding compound 26.

A first extension 311E of the first RDL 31 is extended upwards in the top left, and a plurality of contact pads 311P is configured in the end of the first extension 311E for electronically coupled to, for example, a volume key.

A second extension 312E of the first RDL 31 is extended upwards in the top middle, and a plurality of contact pads 312P is configured in the end of the second extension 312E for electronically coupled to, for example, a speaker.

A third extension 313E of the first RDL 31 is extended upwards in the top right, and a plurality of contact pads 313P is configured in the end of the third extension 313E for electronically coupled to, for example, a camera.

A fourth extension 314E of the first RDL 31 is extended leftwards in the left bottom, and a plurality of contact pads 314P is configured in the end of the fourth extension 314E for electronically coupled to, for example, a microphone.

A fifth extension 315E of the first RDL 31 is extended rightwards in the right bottom, and a plurality of contact pads 315P is configured in the end of the fifth extension 315E for electronically coupled to, for example, a power.

Figure 8:
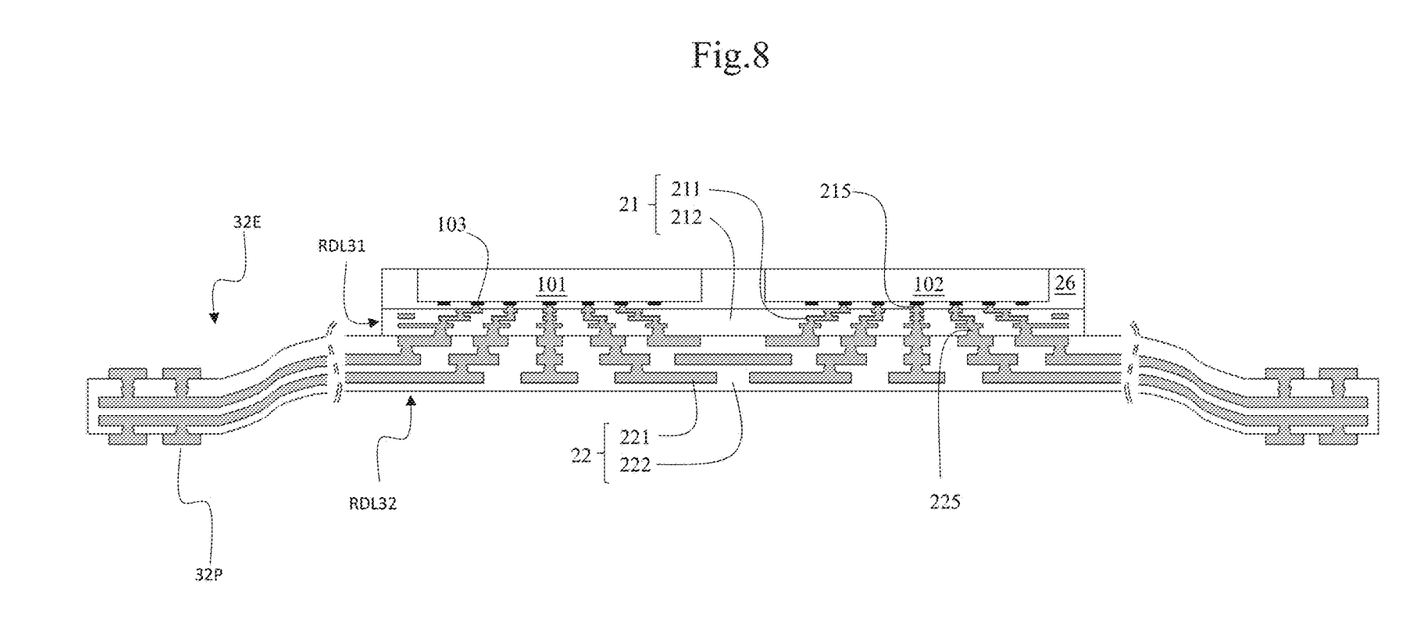
FIG. 8 shows a fifth embodiment according to the present invention.

FIG. 8 Shows a Fifth Embodiment According to the Present Invention.

FIG. 8 shows two chips 101, 102 are embedded in the molding material 26; a first RDL 31 is configured on a bottom surface of the molding material 26; the first RDL 31 has a first redistribution circuitry 211 embedded in a first dielectric layer 212. A plurality of first inverse T-shaped metals 1T of the first RDL 31 electrically coupled to the chips 101, 102. A second RDL 32 is configured on a bottom side of the first RDL 21. The second RDL 22 has a second redistribution circuitry 221 embedded in a second dielectric layer 222. A plurality of second inverse T-shaped metals 2T of the second redistribution circuitry 221 is electrically coupled to the first redistribution circuitry 211.

The second RDL 32 has at least one extension 32E extended beyond a corresponding side surface of the molding compound 26. A plurality of contact pads 32P is configured on a terminal of the at least one extension 32E for electrically coupled to an electronic device such as microphone, power, volume key, speaker, camera . . . etc.

Figure 9:
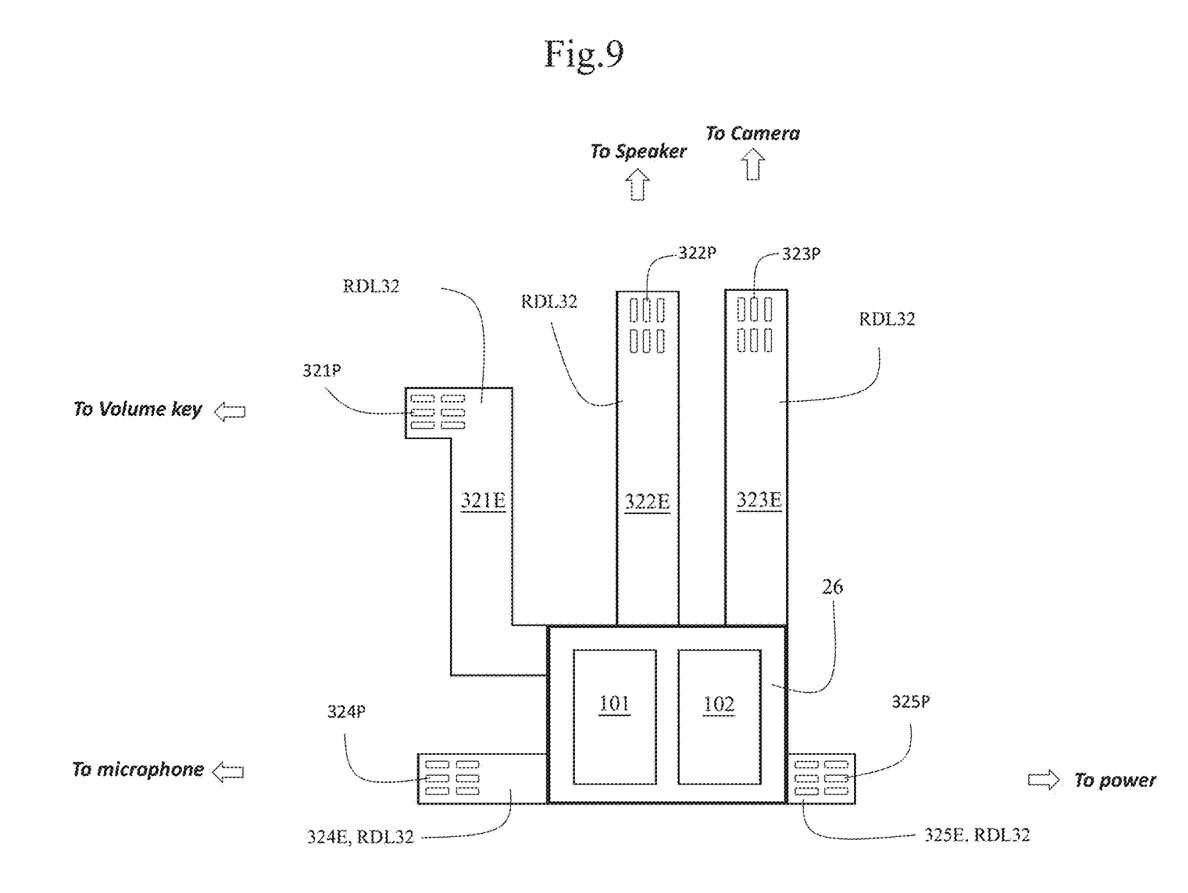
FIG. 9 shows a top view for an application of FIG. 8.

FIG. 9 Shows a Top View for an Application of FIG. 8.

FIG. 9 shows a top view for an application of FIG. 8, for example, in a mobile electronic device. FIG. 9 shows, viewing from top, the two chips 101, 102 are embedded in the molding compound 26.

A first extension 321E of the second RDL 32 is extended upwards in the top left, and a plurality of contact pads 321P is configured in the end of the first extension 321E for electronically coupled to, for example, a volume key.

A second extension 322E of the second RDL 32 is extended upwards in the top middle, and a plurality of contact pads 322P is configured in the end of the second extension 322E for electronically coupled to, for example, a speaker.

A third extension 323E of the second RDL 32 is extended upwards in the top right, and a plurality of contact pads 323P is configured in the end of the third extension 323E for electronically coupled to, for example, a camera.

A fourth extension 324E of the second RDL 32 is extended leftwards in the left bottom, and a plurality of contact pads 324P is configured in the end of the fourth extension 324E for electronically coupled to, for example, a microphone.

A fifth extension 325E of the second RDL 32 is extended rightwards in the right bottom, and a plurality of contact pads 325P is configured in the end of the fifth extension 325E for electronically coupled to, for example, a power.

While several embodiments have been described by way of example, it will be apparent to those skilled in the art that various modifications may be configured without departs from the spirit of the present invention. Such modifications are all within the scope of the present invention, as defined by the appended claims.

NUMERICAL SYSTEM 101, 102 chip
103 I/O pad
11 interposer
110 substrate
111 top RDL
112 bottom RDL
12 package substrate
121 top RDL
122 bottom RDL
13 system board
131 top RDL
132 bottom RDL
141, 142, 143 solder ball
151, 152, 152 underfill
171 through silicon via, TSV
172, 173 through laminate via, TLV
1T, 2T inverse T-shaped metal
21, 22 RDL
211, 221 redistribution circuitry
212, 222 dielectric layer
215, 225 metal vias
251, 252 gold fingers
255 extended area
26 molding material
271 flexible circuit board
272 gold fingers
28 passive component
31, 32 RDL
311E, 312E, 313E, 314E, 315E extension
311P, 312P, 313P, 314P, 315P contact pad
31P, 32P contact pad
321E, 322E, 323E, 324E, 325E extension
321P, 322P, 323P, 324P, 325P contact pad

What is claimed is:

1. A system in package, comprising:
   at least one chip having a plurality of input/output (I/O) pads;
   a molding material wrapping the at least one chip;
   a first redistribution circuitry fabricated according to a first design rule, and configured on a bottom of the molding material, the first redistribution circuitry electrically coupled to the plurality of I/O pads of the chip through a plurality of first inverse T-shaped metals, the first inverse T-shaped metals located at a top of the first redistribution circuitry and being in direct contact with the I/O pads of the chip, the first redistribution circuitry expanded wider from the top of the first redistribution circuitry to a bottom of the first redistribution circuitry; and
   a second redistribution circuitry fabricated according to a second design rule, and configured on the bottom of the first redistribution circuitry, the second redistribution circuitry electrically coupled to the first redistribution circuitry through a plurality of second inverse T-shaped metals, the second redistribution circuitry expanded wider from a top of the first second redistribution circuitry to a bottom of the second redistribution circuitry,
   wherein
   each circuit of the second redistribution circuitry is thicker and wider than each circuit of the first redistribution circuitry,
   the plurality of second inverse T-shaped metals has a distribution density less than a distribution density of the plurality of first inverse T-shaped metals, and
   at least one extension of either the first redistribution circuitry or the second redistribution circuitry extends beyond a corresponding side surface of the molding material,
   wherein a top surface of the molding material facing away the first redistribution circuitry is located at a plane, an orthogonal projection area of the at least one extension of either the first redistribution circuitry or the second redistribution circuitry on the plane connects to and extends beyond an orthogonal projection area of the molding material on the plane.

2. The system in package as claimed in claim 1, wherein each of the plurality of first inverse T-shaped metals has a top via and a bottom flat metal, and no demarcation exists between the top via and the bottom flat metal.

3. The system in package as claimed in claim 1, wherein each of the plurality of second inverse T-shaped metals has a top via and a bottom flat metal, and no demarcation exists between the top via and the bottom flat metal.

4. The system in package as claimed in claim 1, wherein the top surface of the molding material is coplanar with a top surface of the at least one chip.

5. The system in package as claimed in claim 1, further comprising:
   a first dielectric layer embedding the first redistribution circuitry, wherein the first dielectric layer and the embedded first redistribution circuitry form a first redistribution layer (RDL); and
   a second dielectric layer embedding the second redistribution circuitry, wherein the second dielectric layer and the embedded second redistribution circuitry form a second RDL.

6. The system in package as claimed in claim 5, wherein the first RDL has
   the at least one extension; and
   a plurality of first contact pads on a terminal portion of the at least one extension.

7. The system in package as claimed in claim 6, further comprising:
   at least one electronic device electrically coupled to the plurality of first contact pads.

8. The system in package as claimed in claim 7, wherein the at least one device is selected from the group consisting of control key, speaker, camera, microphone, and power supply.

9. The system in package as claimed in claim 5, wherein the second RDL has
the at least one extension; and
a plurality of second contact pads on a terminal portion of the at least one extension.

10. The system in package as claimed in claim 9, further comprising:
at least one electronic device electrically coupled to the plurality of second contact pads.

11. The system in package as claimed in claim 10, wherein
the at least one device is selected from the group consisting of control key, speaker, camera, microphone, and power supply.

12. The system in package as claimed in claim 1, wherein the at least one extension comprises
a first extension extending beyond a first side surface of the molding material, and
a second extension extending beyond a second side surface of the molding material, the second side surface different from the first side surface.

13. The system in package as claimed in claim 12, wherein the at least one extension further comprises
a third extension extending beyond a third side surface of the molding material, the third side surface different from the first and second side surfaces.

14. The system in package as claimed in claim 13, wherein the at least one extension further comprises
a fourth extension extending beyond a fourth side surface of the molding material, the fourth side surface different from the first, second and third side surfaces.

15. The system in package as claimed in claim 1, wherein
the at least one extension belongs to one of the first redistribution circuitry and the second redistribution circuitry, and extends beyond a corresponding side surface of the other of the first redistribution circuitry and the second redistribution circuitry.

16. The system in package as claimed in claim 15, wherein
the at least one extension comprises
a first extension extending beyond a first side surface of the molding material, and beyond a first side surface of the other of the first redistribution circuitry and the second redistribution circuitry, and
a second extension extending beyond a second side surface of the molding material, and beyond a second side surface of the other of the first redistribution circuitry and the second redistribution circuitry,
the second side surface of the molding material is different from the first side surface of the molding material, and
the second side surface of the other of the first redistribution circuitry and the second redistribution circuitry is different from the first side surface of the other of the first redistribution circuitry and the second redistribution circuitry.

17. The system in package as claimed in claim 16, wherein
the at least one extension further comprises
a third extension extending beyond a third side surface of the molding material, and beyond a third side surface of the other of the first redistribution circuitry and the second redistribution circuitry,
the third side surface of the molding material is different from the first and second side surfaces of the molding material, and the third side surface of the other of the first redistribution circuitry and the second redistribution circuitry is different from the first and second side surfaces of the other of the first redistribution circuitry and the second redistribution circuitry.

18. The system in package as claimed in claim 17, wherein
the at least one extension further comprises
a fourth extension extending beyond a fourth side surface of the molding material, and beyond a fourth side surface of the other of the first redistribution circuitry and the second redistribution circuitry,
the fourth side surface of the molding material is different from the first, second and third side surfaces of the molding material, and
the fourth side surface of the other of the first redistribution circuitry and the second redistribution circuitry is different from the first, second and third side surfaces of the other of the first redistribution circuitry and the second redistribution circuitry.

19. A system in package, comprising:
at least one chip having a plurality of input/output (I/O) pads;
a molding material wrapping the at least one chip;
a first redistribution circuitry fabricated according to a first design rule, and configured on a bottom of the molding material, the first redistribution circuitry electrically coupled to the plurality of I/O pads of the chip, the first redistribution circuitry expanded wider from a top of the first redistribution circuitry to a bottom of the first redistribution circuitry, wherein an inverse T-shaped metal of the first redistribution circuitry located at the top of the first redistribution circuitry is in direct contact with the plurality of I/O pads of the chip; and
a second redistribution circuitry fabricated according to a second design rule, and configured on the bottom of the first redistribution circuitry, the second redistribution circuitry electrically coupled to the first redistribution circuitry, the second redistribution circuitry expanded wider from a top of the second redistribution circuitry to a bottom of the second redistribution circuitry,
wherein
each circuit of the second redistribution circuitry is thicker and wider than each circuit of the first redistribution circuitry, and
at least one extension of one of the first redistribution circuitry and the second redistribution circuitry extends beyond a corresponding side surface of the molding material, and beyond a corresponding side surface of the other of the first redistribution circuitry and the second redistribution circuitry,
wherein a top surface of the molding material facing away the first redistribution circuitry is located at a plane, an orthogonal projection area of the at least one extension of either the first redistribution circuitry or the second redistribution circuitry on the plane connects to and extends beyond an orthogonal projection area of the molding material on the plane.

20. The system in package as claimed in claim 19, wherein
the system in package is free of solder balls, an interposer, a package substrate, a system board, and an underfill.

* * * * *